US010847706B2

(12) United States Patent
Ivry et al.

(10) Patent No.: US 10,847,706 B2
(45) Date of Patent: Nov. 24, 2020

(54) SYSTEMS AND METHODS FOR HYBRID SUPERCONDUCTING MEDIUM COMPRISING FIRST AND SECOND LAYERS WITH DIFFERENT SUPERCONDUCTOR TO INDUCE A PROXIMITY EFFECT BETWEEN THEREOF

(71) Applicant: Massachusetts Institute of Technology, Cambridge, MA (US)

(72) Inventors: Yachin Ivry, Brookline, MA (US); Jonathan J. Surick, Cambridge, MA (US); Karl Kimon Berggren, Arlington, MA (US)

(73) Assignee: Massachusetts INSTITUTE of technology, Cambridge, MA (US)

( * ) Notice: Subject to any disclaimer, the term of this patent is extended or adjusted under 35 U.S.C. 154(b) by 444 days.

(21) Appl. No.: 15/907,793

(22) Filed: Feb. 28, 2018

(65) Prior Publication Data
US 2018/0248103 A1 Aug. 30, 2018

Related U.S. Application Data

(63) Continuation of application No. PCT/US2016/049603, filed on Aug. 31, 2016.
(Continued)

(51) Int. Cl.
*H01L 39/12* (2006.01)
*H01L 39/10* (2006.01)
(Continued)

(52) U.S. Cl.
CPC ............. *H01L 39/10* (2013.01); *G01J 1/42* (2013.01); *G01J 1/44* (2013.01); *G01J 5/023* (2013.01);
(Continued)

(58) Field of Classification Search
CPC .......... G01J 1/42; G01J 1/44; G01J 2001/442; G01J 5/10; H01L 39/10; H01L 39/12; H01L 39/24
See application file for complete search history.

(56) References Cited

U.S. PATENT DOCUMENTS

| 4,564,564 A | 1/1986 | Schuller et al. |
| 4,808,488 A | 2/1989 | Chevrel et al. |
| (Continued) | | |

FOREIGN PATENT DOCUMENTS

| CN | 104091884 A | 10/2014 |
| CN | 104183692 A | 12/2014 |
| (Continued) | | |

OTHER PUBLICATIONS

Brinkman et al., The proximity effect in normal meta—multiband superconductor hybrid structures. Physical Review B, (21) 2004. 5 pages.
(Continued)

*Primary Examiner* — Que Tan Le
(74) *Attorney, Agent, or Firm* — Smith Baluch LLP

(57) ABSTRACT

A superconducting medium includes a first layer made of a first superconductor and a second layer made of a second superconductor. The first layer has a first thickness less than a first coherence length of the first superconductor. The second layer has a second thickness less than a second coherence length of the second superconductor so as to induce a proximity effect between the first layer and the second layer. The proximity effect can induce desirable properties in the resulting superconducting medium. Controlling the thickness ratio of the first layer to the second layer can also tune the property of the superconducting medium.

31 Claims, 11 Drawing Sheets

Related U.S. Application Data

(60) Provisional application No. 62/212,636, filed on Sep. 1, 2015.

(51) Int. Cl.

| | |
|---|---|
| *G01J 1/44* | (2006.01) |
| *G01J 1/42* | (2006.01) |
| *G01J 5/04* | (2006.01) |
| *G01J 5/02* | (2006.01) |
| *G01J 5/10* | (2006.01) |
| *H01L 39/22* | (2006.01) |
| *H01L 39/24* | (2006.01) |

(52) U.S. Cl.
CPC ............... *G01J 5/024* (2013.01); *G01J 5/046* (2013.01); *G01J 5/10* (2013.01); *H01L 39/12* (2013.01); *H01L 39/225* (2013.01); *G01J 2001/442* (2013.01); *G01J 2001/4446* (2013.01); *H01L 39/24* (2013.01)

(56) References Cited

U.S. PATENT DOCUMENTS

| | | |
|---|---|---|
| 4,834,856 A | 5/1989 | Wehner |
| 5,024,992 A | 6/1991 | Morris |
| 5,407,903 A | 4/1995 | Nakamura et al. |
| 5,661,112 A | 8/1997 | Hatta et al. |
| 5,880,468 A | 3/1999 | Irwin et al. |
| 5,998,336 A | 12/1999 | Holcomb |
| 6,420,318 B1 | 7/2002 | Holcomb |
| 6,455,849 B1 | 9/2002 | Hilton et al. |
| 6,459,097 B1 | 10/2002 | Zagoskin |
| 7,115,927 B2 | 10/2006 | Hideki et al. |
| 7,432,790 B2 | 10/2008 | Arndt et al. |
| 8,761,848 B2 | 6/2014 | Berggren et al. |
| 8,871,559 B2 | 10/2014 | Horii et al. |
| 9,741,919 B2 * | 8/2017 | Chen ................... H01L 29/0676 |
| 2004/0162223 A1 | 8/2004 | Walter et al. |
| 2006/0251954 A1 | 11/2006 | Merzougui et al. |
| 2014/0299751 A1 | 10/2014 | Tang et al. |

FOREIGN PATENT DOCUMENTS

| | | |
|---|---|---|
| EP | 0482198 | 9/1992 |
| JP | 2523517 B2 | 8/1996 |
| WO | 2014135749 A1 | 9/2014 |

OTHER PUBLICATIONS

International Search Report and Written Opinion in PCT/US2016/049603 dated Nov. 10, 2016. 16 pages.

* cited by examiner

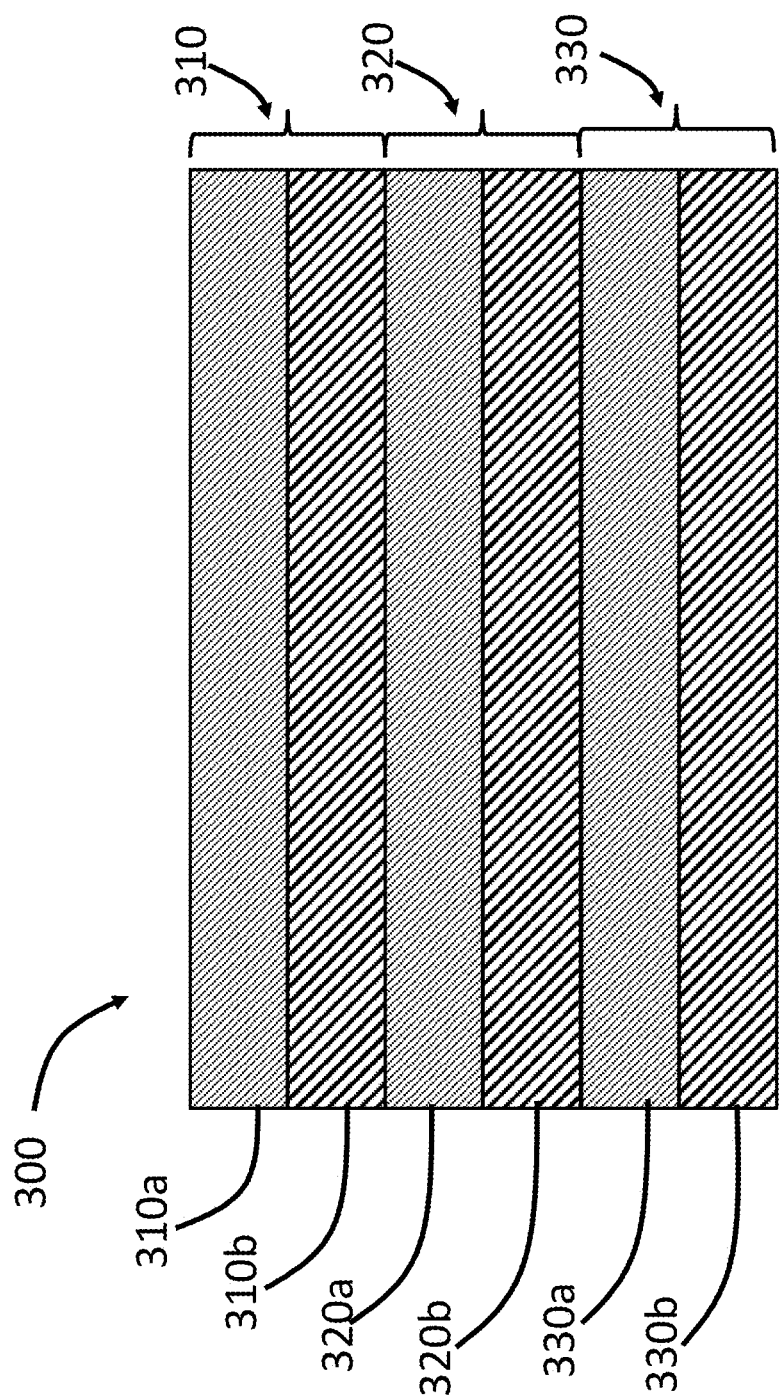

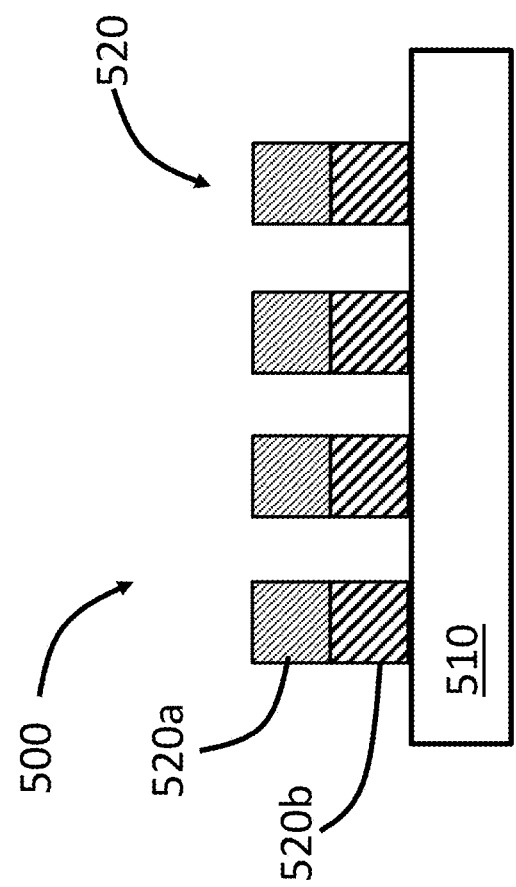
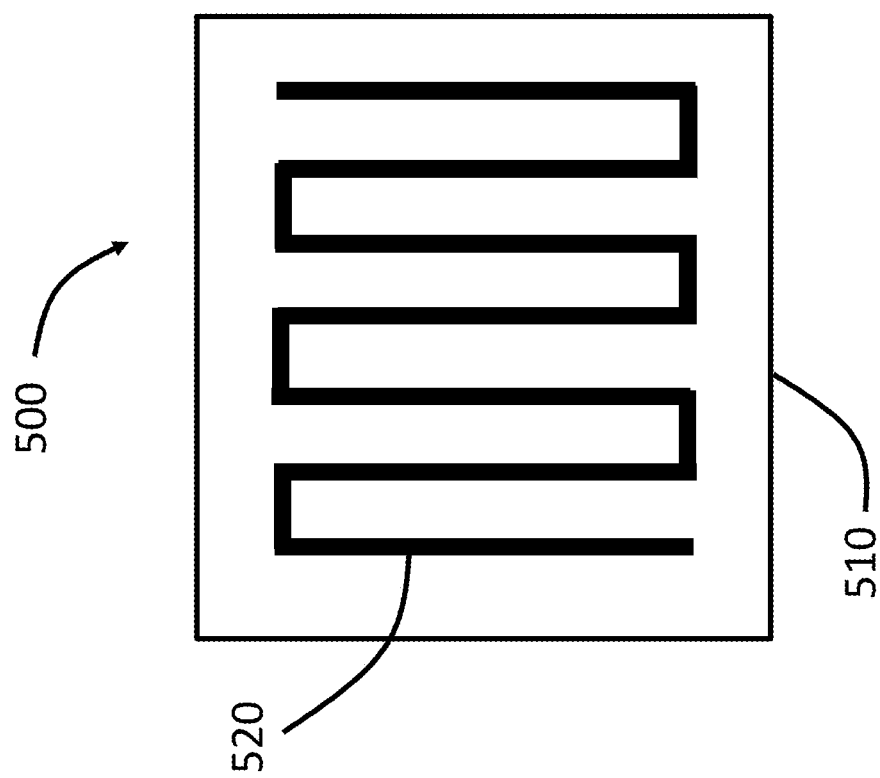
FIG. 5B
FIG. 5A

SYSTEMS AND METHODS FOR HYBRID SUPERCONDUCTING MEDIUM COMPRISING FIRST AND SECOND LAYERS WITH DIFFERENT SUPERCONDUCTOR TO INDUCE A PROXIMITY EFFECT BETWEEN THEREOF

CROSS-REFERENCES TO RELATED APPLICATIONS

This application is a bypass continuation of International Application No. PCT/US2016/049603, filed Aug. 31, 2016, and entitled "SYSTEMS AND METHODS FOR HYBRID SUPERCONDUCTING MEDIUM," which in turn the priority benefit under 35 U.S.C. § 119(e) of U.S. Application No. 62/212,136, filed Aug. 31, 2015, entitled "HYBRID SUPERCONDUCTING STRUCTURES AND DEVICES," which is hereby incorporated herein by reference in its entirety.

GOVERNMENT SUPPORT

This invention was made with government support under Grant No. ECCS-1128222 awarded by National Science Foundation and under Grant No. N00014-13-1-0774 awarded by the Office of Naval Research. The government has certain rights in the invention.

BACKGROUND

Superconductors can find applications in a wide range of areas, including sensitive magnetic field measurement, power transmission, fast digital circuits, radio frequency and microwave filters, high sensitivity particle and photon detectors, emerging technologies such as low-power computation, and quantum technologies, including quantum computation and quantum communication, among others. Various types of metallic compounds and alloys have been developed to accommodate specific requirements from different applications.

To allow applications of superconductors in new areas or improve the performance of superconductors in existing applications, it can be beneficial to enhance and control the functionality of superconductors. A straightforward way of doing so is to discover new superconductor materials such as new compositions of metal alloys, but this method is usually costly and time consuming. Other methods include chemical doping, removing or adding ions such as oxygen to alter the critical temperature of the material. Optical methods can also be used. For example, a thin layer one organic molecule thick can be placed above a superconducting film that is approximately 50 nanometers thick. A light then illuminates the thin layer to cause the molecules to stretch and change shape, altering the properties of the underlying superconducting film, including altering the critical temperature. These methods usually involve complex chemical processing. In addition, they typically work for only certain limited types of superconducting materials, thereby hindering their widespread use.

SUMMARY

Embodiments of the present invention include apparati, systems, and methods directed to superconducting media or devices, and uses thereof. In one example, a superconducting medium includes a first layer comprising a first superconductor. The first layer has a first thickness less than about three times the coherence length of the second superconductor. The superconducting medium also includes a second layer comprising a second superconductor. The second superconductor is different from the first superconductor. The second layer is disposed on the first layer and has a second thickness less than about three times the coherence length of the first superconductor so as to induce a proximity effect between the first layer and the second layer.

In another example, a method of fabricating a superconducting medium includes providing a first layer comprising a first superconductor. The first layer has a first thickness less than about three times the coherence length of the second superconductor. The method also includes disposing a second layer comprising a second superconductor, different from the first superconductor, onto the first layer so as to form the superconducting medium. The second layer has a second thickness less than about three times the coherence length of the first superconductor so as to induce an proximity effect between the first layer and the second layer.

In yet another example, a single photon detector includes a substrate and a superconductive nanowire meander structure disposed on the substrate to receive incident photons. The superconductive nanowire meander structure has a width less than 100 nm and includes a first layer and a second layer disposed on the first layer. The first layer includes NbN and has a first thickness less than 3 nm. The second layer includes $W_xSi_{1-x}$ disposed on the first layer and has a second thickness less than 3 nm so as to induce a proximity effect between the first layer and the second layer.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 3 shows a side view of a superconducting medium including multiple layers of the superconducting medium shown in FIG. 2.

FIGS. 5A and 5B show a top view and a side view, respectively, of a superconducting nanowire single photon detector using composite superconducting medium.

DETAILED DESCRIPTION

To enhance and control the properties of superconducting materials, the techniques described in this application employ the proximity effect to combine at least two superconductors to effectively form a new superconducting material (also referred to as a superconducting medium). The two (or more) superconducting materials of the present invention can be disposed adjacent each other in the form of films, wires, or any geometric shape, provided that at least a portion of at least two of the superconducting materials have a dimension within about three times the proximitized coherence length of the adjacent superconductor as described herein. In various embodiments, each individual superconductor has a dimension (e.g., thickness, width, or other dimensions) less than about three times the proximitized coherence length of the adjacent superconductor. In particular embodiments, each superconductor has a dimension less than about 2.5, less than about 2, less than about 1.5, or less than about the proximitized coherence length of the adjacent superconductor. Since the transition between proximitization is not always sharply tied to the nominal coherence length, the dimensions of the superconductors of the present invention are defined by the presence of the proximitization effect in both superconducting layers, and are not restricted to the nominal coherence length. In this case, electrons in one superconductor can diffuse into another so as to allow the new material to have the desirable properties of each individual superconductor. This process is also referred to as hybridization in this application Hybridization techniques in this application can conveniently accommodate specific requirements in applications by combining existing superconductors with known properties. For example, in superconducting nanowire single photon detectors (SNSPDs), it can be desirable to have short characteristic time constants and high detection efficiency. A new superconducting material having both desirable properties can then be fabricated by combining one superconductor having short characteristic time with another superconductor having high detection efficiency.

Figures 1A, 1B, 1C:
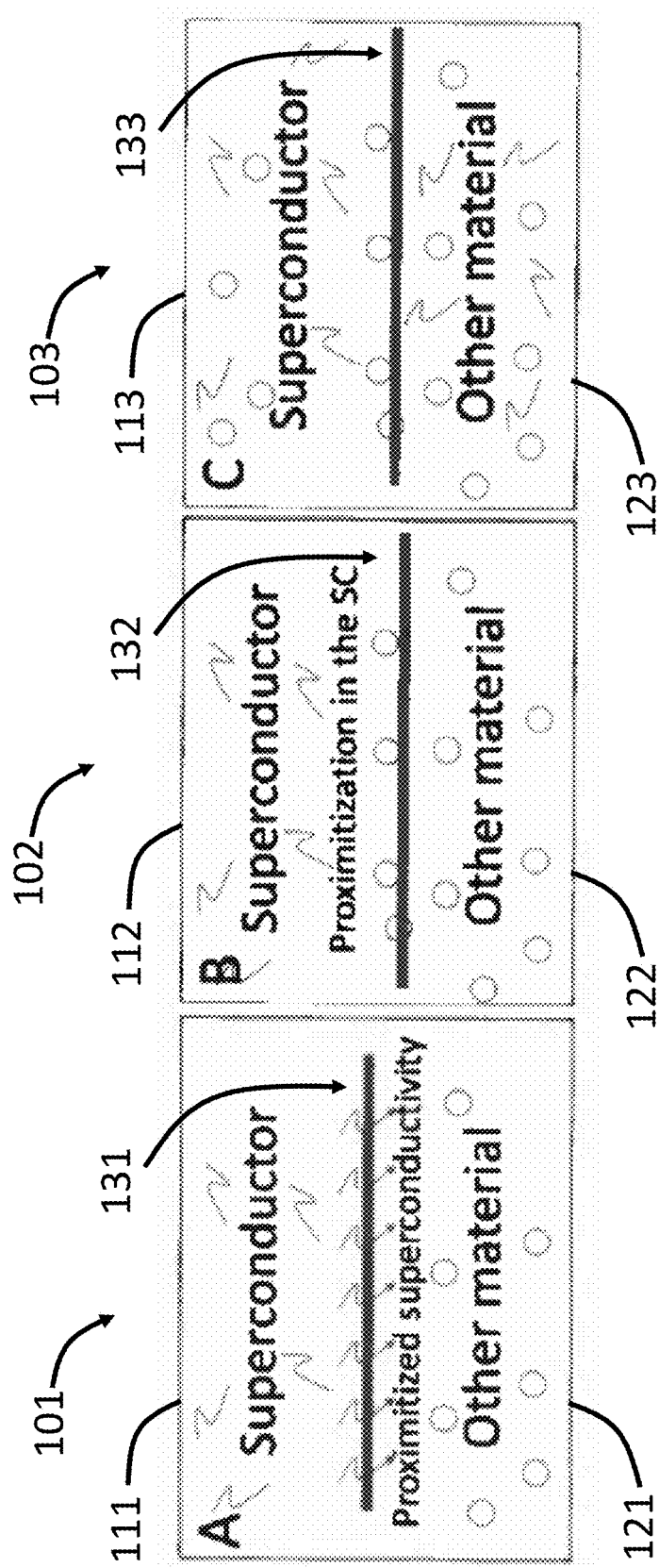
FIG. 1A illustrates direct proximity effect between a superconductor and another material.
FIG. 1B illustrates inverse proximity effect between a superconductor and another material.
FIG. 1C illustrates proximity effect between a superconductor and another material, each of which have dimensions less than a coherence length of the respective material.

FIGS. 1A-1C illustrate the hybridization process using proximity effect. FIG. 1A illustrates a direct proximity effect 101, in which a superconductor 111 is disposed on another material 121 such as a metal. Electrons in the superconductor 111 can migrate through the boundary 131 (also referred to as an interface) into the material 121 and locally induce superconducting properties in the material 121. The induced superconducting properties usually exist within a short length scale beneath the boundary 131. This short length scale is also referred to as the coherence length.

FIG. 1B illustrates an inverse proximity effect 102, in which a superconductor 112 is disposed on another material 122. In an inverse proximity effect, electrons from the material 122 can diffuse through the boundary 132 and into the superconductor 112 and locally induce properties of the material 122 in the superconductor 112. For example, the material 122 can be a ferromagnet and the proximity effect can integrate functional magnetic properties into the superconductor 112. Likewise, proximitizing the superconductor 112 with a normal metal 122 can also suppress superconductivity and hence allow limited tenability of the functionality.

FIG. 1C illustrates a proximity effect between a superconductor 113 and another material 123. The two materials 113 and 123 define a boundary 133. In this case, the superconductor 113 and the material 123 are thinner than the coherence length of the respective material. When the two substances are of a dimension that is smaller than the typical proximity effect length scale, the properties of the adjacent materials can be mixed so that the obtained hybrid structure is effectively a new material. The properties of the hybrid material can be both enhanced and tuned, for example, by integrating two materials with complimentary properties and by changing the ratio between its two components. This hybridization of two superconducting materials can also synergistically enhance the properties of the new superconducting medium.

Based on the above illustrations, the properties of a superconductor of a small physical dimension can be both enhanced and controlled by proximitizing it to another small physical dimension material. If the dimensions of the two materials are at the range where the proximate effect occurs (e.g. within about three times the effective coherent length, at least along one of the directions), the hybridization effectively creates a new superconductor with enhanced and controlled functionality.

For instance, by proximitizing two thin layers of two different superconductors, the superconducting electrons of the film with the higher critical temperature $T_{c1}$ can be induced into the superconducting film with the lower critical temperature $T_{c2}$. As a result, the entire bilayer becomes superconducting, e.g., at a temperature between $T_{c1}$ and $T_{c2}$. In another example, proximitizing two thin layers of two different superconductors can enhance the critical temperature $T_c$ of the hybrid superconductor with respect to both $T_{c1}$ and $T_{c2}$ ($T_c > T_{c1}$ and $T_c > T_{c2}$)

Moreover, because the electrons can now freely diffuse from one film to another, many of the properties, including electrical properties, optical properties, and thermal properties, among others, can now be shared. Thus, the resultant hybrid superconductor can enjoy the properties of the two constituent materials. Alternatively, specific properties of the resultant hybrid superconductor (critical superconducting current, kinetic inductance, electrical resistivity, coherence length, diffusion length, heat capacity, heat conductivity, optical absorptance etc.) can be enhanced relative to the individual constituent superconductors.

Furthermore, the specific properties of the hybrid structure can be adjusted by tuning the ratio between the volume/ thickness of the two films. This process can also be extended to structures other than films or structures including more than two materials. Alternatively, changing a temperature of the constituent materials can also adjust the physical property of the hybrid structure including the constituent materials.

Figure 2:
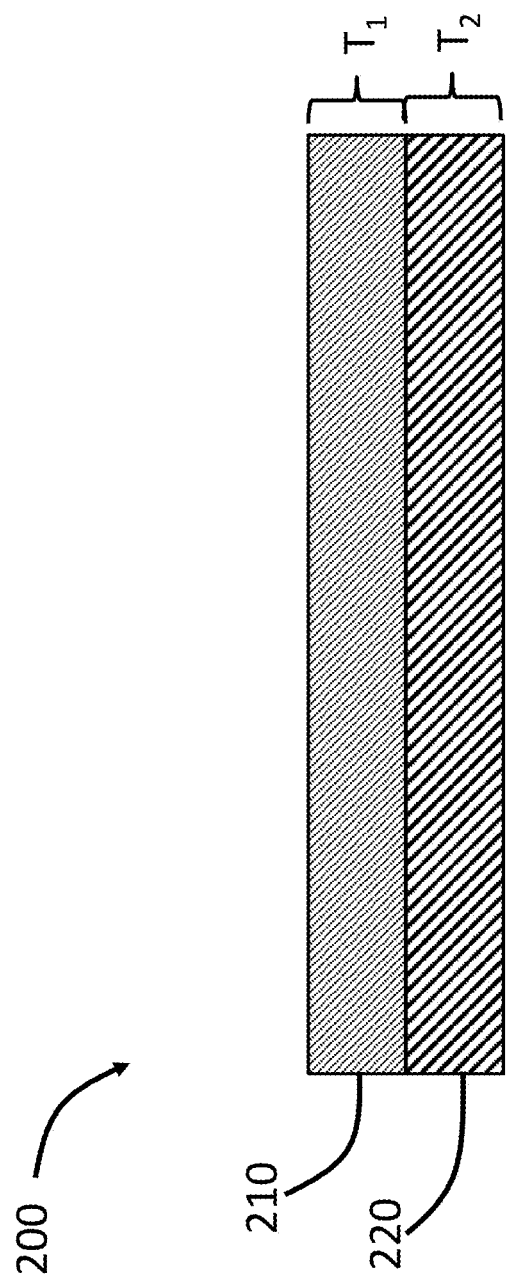
FIG. 2 shows a side view of a superconducting medium including two superconductors and each superconductor has a thickness less than a respective coherence length.

FIG. 2 shows a side view of a superconducting medium 200 based on proximity effect described above. The superconducting medium 200 includes a first layer 210 made of a first superconductor and a second layer 220 made of a second superconductor. The two layers 210 and 220 are disposed together via, for example, deposition processes. The thickness $T_1$ of the first layer is less than the coherence length of the first superconductor and the thickness $T_2$ of the second layer is less than the coherence length of the second superconductor. In this case, electrons from one layer (210 or 220) can diffuse into the other layer (220 or 210) and induce proximity effect, which in turn causes the resulting superconducting medium 200 to share desirable properties of the first layer 210 and the second layer 220.

As understood in the art, the coherence length (also referred to as the proximity length) of a superconductor can be regarded as the "size" of a Cooper pair and can characterize the shortest distance over which superconductivity can be established in a material (although superconductivity can persist in thicknesses shorter than the coherence length). Superconductivity can also persist beyond the proximitized coherence length (e.g., three times or greater than the proximitized coherence length). A Cooper pair is the basic unit of super-current in a superconductor and is a pair of electrons that are coupled by weak interactions to lattice vibrations. Cooper pairs can comprise long-range coupling of electrons and often across many unit cells. Without being bound by any particular theory or mode of operation, superconductivity can arise from the collective motion of many Cooper pairs. The relative orbital angular momentum of the Cooper pair can have a value of zero (referred to as an "s-wave"), one (referred to as a "p-wave"), two (referred to as a "d-wave"), and so forth.

Coherence length of a superconductor can be defined in at least two ways. First, in "clean" metals (i.e. no impurities), Cooper pairs sustain a diffusion over the thermal coherence length:

$$\xi_{M,C} = \hbar v_F / (2\pi k_B T) \quad (1)$$

where $v_F$ is electron velocity at the Fermi energy. This definition according to Equation (1) is also referred to as the ballistic coherence length.

The second definition of the coherence length is also referred to as the diffusive coherence length. In this definition, the superconductor includes impurities or a high degree of disorder. As a result, scattering processes can limit the penetration length of the Cooper pairs. In this case, the mean free path of electrons l can be shorter than $\xi_{M,C}$, and this is also called the 'dirty limit', and the coherence length can be given by:

$$\xi_{M,D} = \sqrt{\hbar D/(2\pi k_B T)} \quad (2)$$

where D is the diffusion coefficient $D = v_F l/3$.

Equations (1) and (2) show that the coherence length of a superconductor depends on several parameters. For example, the coherence length depends on the temperature of the superconductor, which can be externally tuned. The coherence length also depends on the Fermi velocity $v_F$, which in turns depends on the type of the superconductor. The coherence length, in diffusive definition, also depends on the mean free path l of the electrons in the superconductor. Therefore, in the superconducting medium 200 shown in FIG. 2, the coherence length of each layer 210 and 220 can be controlled by adjusting these parameters.

In hybrid superconducting medium discussed here, there are two types of coherence lengths. First, each superconductor has a typical coherence length (e.g., defined by Equations (1) and/or (2)), depending on the chemical composition of the material, temperature, material dimension, and external magnetic field. Second, each superconductor also has the coherence length due to the proximity effect, depending on the diffusion length or Fermi velocity and the temperature. The first coherence length can be valid to any superconductor, while the second type exists typically in proximitized superconductivity. In hybrid superconducting medium described herein, both types of coherence length exist or actually, coexist.

In practice, the thickness $T_1$ and $T_2$ can be about a fraction of a nanometer to a few hundreds of nanometers (e.g., about 0.1 nm, about 0.2 nm, about 0.5 nm, about 1 nm, about 2 nm, about 5 nm, about 10 nm, about 20 nm, about 50 nm, about 100 nm, about 200 nm, about 500 nm, or about 1000 nm, including any values and sub ranges in between).

In one example, the first thickness $T_1$ can be the same as the second thickness $T_2$. In another example, the first thickness $T_1$ can be the different from the second thickness $T_2$. Controlling the thickness ratio $T_1/T_2$ can control the property of the resulting superconducting medium 200. The thicknesses $T_1$ and $T_2$ can be any fraction of the total thickness of the composite structure $T_1+T_2$. For example, the ratio $T_1/(T_1+T_2)$ can be about 0.05, about 0.10, about 0.15, about 0.20, about 0.25, about 0.30, about 0.35, about 0.40, about 0.45, about 0.50, about 0.55, about 0.60, about 0.65, about 0.70, about 0.75, about 0.80, about 0.85, about 0.90, or about 0.95. Correspondingly, the ratio $T_2/(T_1+T_2)$ can be about 0.95, about 0.90, about 0.85, about 0.80, about 0.75, about 0.70, about 0.75, about 0.60, about 0.55, about 0.50, about 0.45, about 0.40, about 0.35, about 0.30, about 0.25, about 0.20, about 0.15, about 0.10, or about 0.05. In another example, the above ratios can also be used between any two superconductors in a hybrid structure made of more than two superconductors. Similarly, when the materials of the present invention include three (or more) superconducting materials disposed in each other, each with a thickness within about three times the coherence length of an adjacent superconductor, the thicknesses of each layer may be a fraction of the total thickness of the composite structure. In general, $T_i/\Sigma_1^n T_i$ can be about 0.05, about 0.10, about 0.15, about 0.20, about 0.25, about 0.30, about 0.35, about 0.40, about 0.45, about 0.50, about 0.55, about 0.60, about 0.65, about 0.70, about 0.75, about 0.80, about 0.85, about 0.90, or about 0.95.

As described above, the superconducting medium 200 can have the property of one of the constituent layer 210 or 220. For example, the first superconductor in the first layer 210 has a first value of a physical property and the second superconductor in the second layer 220 has a second value of the same physical property. Induced by the proximity effect, the value of the physical property of the superconducting medium 200 is substantially equal to the first value of the first layer 210 or the second value of the second layer 220. In some cases, the proximity effect can synergistically enhance the physical property by making the value of the physical property of the superconducting medium greater than both the first value and the second value (or less than both the first value and the second value). Similarly, the proximity effect can also induce in the resulting superconducting medium chemical property, biological property, mechanical property, or any other property known in the art.

In one example, the physical property includes any property that depends on the electronic behavior, such as the electro-optical property, the electro-mechanical property, the electromagnetic property, and the supercurrent (also referred to as superconducting current), kinetic inductance, sheet resistance, among others.

In another example, the physical property includes critical superconductor properties, such as the critical magnetic field, the critical current, the critical temperature, and the resistance at normal state, among others.

In yet another example, the physical property includes optical properties, such as optical absorption, optical reflection, refractive index, dispersion, self-phase modulation, cross-phase modulation, Kerr effect, Raman scattering, Brillouin scattering, and multi-photon absorption, among others.

In yet another example, the physical property includes kinetic inductance, electrical resistivity, coherence length, diffusion length, heat capacity, and heat conductivity. In yet another example, the physical property includes magnetic penetration length, critical magnetic field, and electron-phonon coupling.

In one example, the first superconductor in the first layer 210 includes NbN and the second superconductor in the second layer 220 includes $W_xSi_{1-x}$, where x can be, for example, about 0.1 to about 0.9 (e.g., about 0.1, about 0.2, about 0.3, about 0.35, about 0.4, about 0.45, about 0.5, about 0.55, about 0.6, about 0.625, about 0.65, about 0.7, about 0.8, and about 0.9 including any values and sub ranges in between). One example of $W_xSi_{1-x}$ can be $W_5Si_3$ (x=0.625) that is commercially available. In this case, the hybrid superconductor 200 can be used to construct, for example, a superconducting nanowire single photon detector (SNSPD).

In another example, the first superconductor in the first layer 210 includes a crystalline material (e.g., single crystalline or polycrystalline) and the second superconductor in the second layer 220 includes amorphous superconductors.

In yet another example, the first superconductor in the first layer 210 includes a conventional superconductor and the second superconductor in the second layer 220 includes an unconventional superconductor. A conventional superconductor can refer to a superconducting material with an isotropic order parameter, such as an s-wave superconductor. Most low temperature superconductors are conventional, such as aluminum. An unconventional superconductor can refer to a superconducting material with either an anisotropic order parameter or one that violates time reversal symmetry. Examples include all non s-wave superconducting materials, such as d-wave and p-wave materials. Most high temperature superconductors known at this time are also unconventional.

In general, it will be appreciated that the superconducting media or devices of the present invention will comprise at least two (but optionally 3, 4, 5, or more) adjacent superconducting layers (which can be in the form of wires or planar layers of any geometry) in which the dimensions of the layers are within about 3 times the proximitized coherence length as described herein. The individual materials of each superconducting layer are different, but can individually comprise any superconducting material known in the art, including conventional and unconventional superconductors, including, as a non-limiting list, aluminum, lead, niobium, $YBa_2Cu_3O_x$, $Bi_2Sr_2Ca_{n-1}Cu_nO_{2n+4}$, $Tl_2Ba_2CuO_x$, $HgBa_2CuO_4$, $Sr_2RuO_4$, $CeIrIn_5$, $MgB_2$, iron pnictide superconductors (such as LaFeAsO, SmFeAsO, PrFeAsO, etc.; $BaFe_2As_2$, $SrFe_2As_2$ or $CaFe_2As_2$; LiFeAs, NaFeAs, LiFeP, $Sr_2ScFePO_3$, and doped forms thereof), and organic superconductors (e.g., $(TMTSF)_2PF_6$, Bechgaard salts, Fabre salts, graphite intercalaction compounds, and alkalie doped fullerenes). Other unconventional superconductors include topological superconductors (e.g., $Sr_2RuO_4$), heavy Fermion superconductor ($CeCu_2Si_2$, $CeCoIn_5$, $CeIn_3$, $UPt_3$, $URu_2Si_2$, $UPd_2Al_3$, and $UNi_2Al_3$), 2D superconductor (e.g., $NbSe_2$), and interface superconductor (e.g., the interface between $LaAlO_3$ and $SrTiO_3$)

In yet another example, the first superconductor in the first layer 210 includes an s-wave superconductor and the second superconductor in the second layer 220 includes a d-wave superconductor. In still another example, the first superconductor in the first layer 210 includes an s-wave superconductor and the second superconductor in the second layer 220 includes a p-wave superconductor.

In yet another example, the first superconductor in the first layer 210 includes at least one of aluminum, lead, and niobium, and the second superconductor in the second layer 220 includes at least one of $YBa_2Cu_3O_x$, $Bi_2Sr_2Ca_{n-1}Cu_nO_{2n+4}$, $Tl_2Ba_2CuO_x$, $HgBa_2CuO_4$, $Sr_2RuO_4$, and $CeIrIn_5$.

In the descriptions above, coherence length of superconductor is used as an upper bound of the thickness of constituent layers (e.g., layers 210 and 220) in a hybrid superconductor (e.g., 200 in FIG. 2). In practice, superconductivity that is induced via the proximity effect can actually extend to a distance longer than the coherence length. Accordingly, the thickness of the constituent layers in a hybrid superconductor can also be increased. For example, the thickness of constituent layers can be 2 times greater than the coherence length (e.g., 2 times greater, 3 times greater, 4 times greater, or 5 times greater, including any values and sub ranges in between).

FIG. 2 shows that the constituent superconductors in the superconducting medium 200 are configured into layers 210 and 220 for illustrating purposes only. In practice, the two constituent superconductors can be configured into any other shape or structure. In general, a hybrid superconducting medium can be constructed when two superconductors are disposed together and the dimension along at least one direction of the superconductor is less than the coherence length of the superconductor.

FIG. 3 shows a superconducting medium 300 including a stack of hybrid superconductor sheets. The superconducting medium 300 includes a first superconductor sheet 310, a second superconductor sheet 320, and a third superconductor sheet 330. Each superconductor sheet 310 to 330 further includes a bilayer structure. The first superconductor sheet 310 includes a first layer 310a and a second layer 310b. Similarly, the second superconductor sheet 320 includes a first layer 320a and a second layer 320b, and the third superconductor sheet 330 includes a first layer 330a and a second layer 330b. The first layers 310a, 320a, and 330a include a first superconductor material and the second layers 310b, 320b, and 330b include a second superconductor material. In addition, each layer (310a to 330a and 310b to 330b) has a thickness less than a coherence length of the respective layer. In this manner, each sheet 310 to 330 is a hybrid superconductor substantially similar to the superconducting medium 200 shown in FIG. 2.

In one example, the superconductors sheets 310, 320, and 330 can be substantially identical to each other. The stack of the superconductor sheets 310, 320, and 330 can be used to achieve, for example, a desired thickness or other form factors of the resulting superconducting medium 300. In another example, the superconductor sheets 310, 320, and 330 can be different from each other.

Three superconductor sheets 310 to 330 are shown in FIG. 3 for illustrating purposes only. In practice, the superconducting medium 300 can include any number of superconductor sheets depending on, for example, specific application requirements.

Figure 4A:
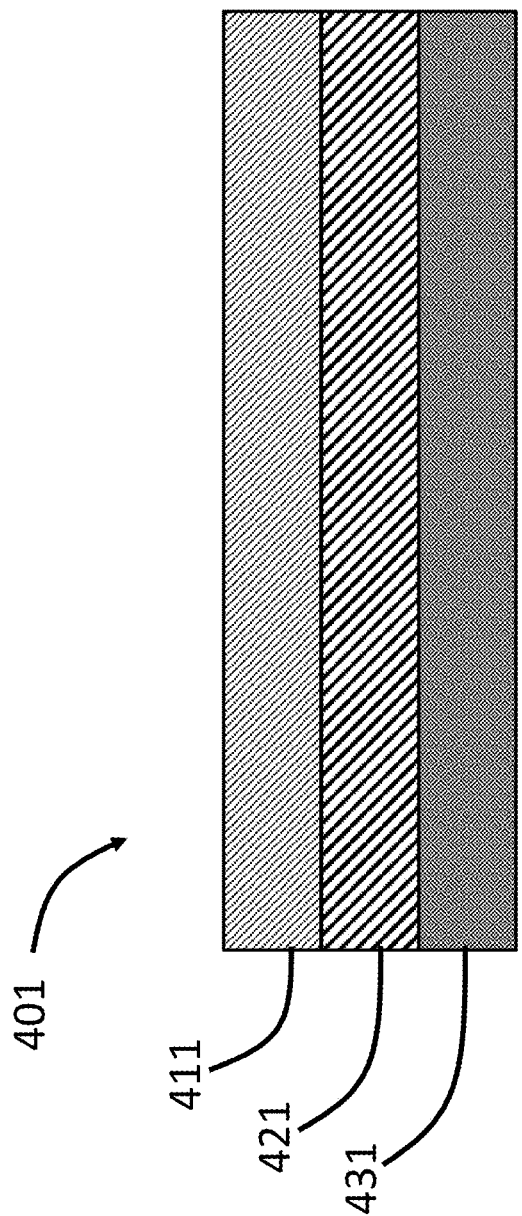
FIG. 4A shows a side view of a superconducting medium including a combination of three superconductors.

FIG. 4A shows a side view of the superconducting medium 401 including three layers 411, 421, and 431. The first layer 411 includes a first superconductor, the second layer 421 includes a second superconductor, and the third layer 431 includes a third superconductor. Each layer 411 to 431 is thinner than a coherence length of the respective layer so as to induce proximity effect among the three layers. In this case, the resulting superconducting medium 300 can have the properties of all three layers 411 to 431.

In some examples, the combination of adjacent two layers can also have a combined thickness less than a coherence length of the superconductor in each constituent layer. For example, the total thickness of the first layer 411 and the second layer 421 can be less than the coherence length of the first superconductor and the second superconductor, whichever is smaller. In this case, electrons in the third layer 431 can diffuse into both the first layer 411 and the second layer 421 to induce proximity effect in these two layers. Similarly, the total thickness of the second layer 421 and the third layer 431 can be less than the coherence length of the second superconductor and the third superconductor, whichever is smaller. In this case, electrons in the first layer 411 can diffuse into both the second layer 421 and the third layer 431 to induce proximity effect in these two layers.

The superconducting medium 401 shown in FIG. 4A includes three different superconductor materials for illustrating purposes only. In practice, the superconducting medium 401 can include any other number of superconductor materials.

Figure 4C:
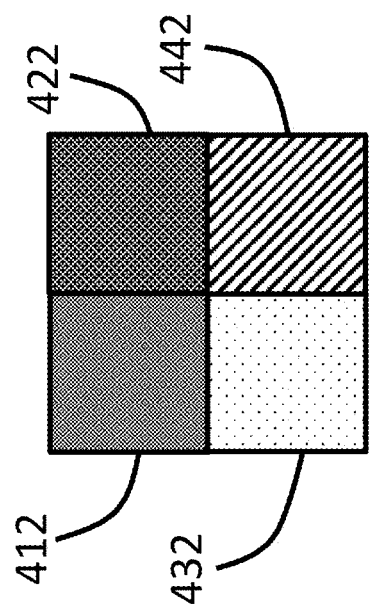
FIGS. 4B and 4C show a top view and a cross sectional view, respectively, of a superconducting medium including four superconductors.
Figure 4B:
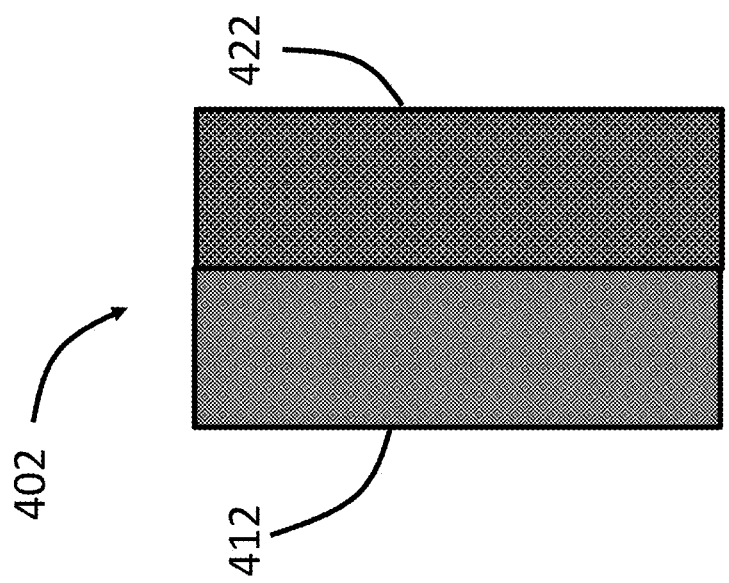

FIGS. 4B and 4C show a top view and a cross sectional view, respectively, of a superconducting medium 402 including a hybrid of four superconductors. The superconducting medium 420 includes a first column 412 made of a first superconductor, a second column 422 made of a second superconductor, a third column 432 made of a third superconductor, and a fourth column 412 made of a fourth superconductor. The four columns 412 to 442 form a 2×2 matrix on the cross section, as shown in FIG. 4C.

In one example, each column 412 to 442 has a square cross section and the length of each side of the square shape is less than the coherence length of the superconductor material in the respective column. In another example, each column 412 to 442 has a rectangular cross section and the length of at least one side of the rectangular shape is less than the coherence length of the superconductor material in the respective column.

Four columns 412 to 442 are shown in FIGS. 4B-4C for illustrating purposes. In practice, the superconducting medium 402 can include any other number of columns. For example, each column 412 to 442 has a hexagon cross section and the length of at least one side of the hexagon shape is less than the coherence length of the superconductor material in the respective column. In this example, the columns 411 to 441 can form a honeycomb structure. In another example, each column can have an irregular shape (e.g., similar to irregular-shaped floor tiles), provided that adjacent columns can have sufficient contact area for the electrons to diffuse from one column to another.

FIGS. 5A and 5B shows a top view and a side view of a superconducting nanowire single photon detector (SNSPD) 500 using hybrid superconducting medium. The detector 500 includes a substrate 510 and a superconducting nanowire meander structure 520 disposed on the substrate. The superconducting nanowire meander structure 520 can have a width of about 10 nm to about 1000 nm (e.g., about 10 nm, about 20 nm, about 30 nm, about 50 nm, about 80 nm, about 100 nm, about 200 nm, about 300 nm, about 500 nm, about 800 nm, and about 1000 nm, including any values and sub ranges in between). The height of the superconducting nanowire meander structure 520 can be about 1 nm to about 20 nm (e.g., about 1 nm, about 2 nm, about 3 nm, about 4 nm, about 5 nm, about 7.5 nm, about 10 nm, about 12 nm, about 15 nm, about 18 nm, or about 20 nm, including any values and sub ranges in between). The total length of the superconducting nanowire meander structure 520 can be about 10 μm to about 2000 μm (e.g., about 10 μm, about 20 μm, about 30 μm, about 50 μm, about 80 μm, about 100 μm, about 200 μm, about 300 μm, about 500 μm, about 800 μm, about 1000 μm, about 1200 μm, about 1500 μm, about 1800 μm, about 2000 μm, including any values and sub ranges in between).

As shown in FIG. 5B, the superconducting nanowire meander structure 520 includes two layers: a first layer 520a made of a first superconductor and a second layer 520b made of a second superconductor. The second layer 520b is disposed on the first layer 520a. Each layer (520a and 520b) has a thickness less than the coherence length of the corresponding superconductor in the respective layer.

Without being bound by any particular mechanism, in operation, a photon incident on the nanowire meander structure 520 may break Cooper pairs and reduces the local critical current below that of the bias current applied on the nanowire meander structure 520. This can result in the formation of a localized non-superconducting region (also referred to as a hotspot) with finite electrical resistance. By measuring the finite resistance, the detector 500 can detect the presence of a photon.

It can be desirable for an SNSPD to have short characteristic time constants (e.g. short reset time and uncertainty in time arrival, also referred to as timing jitter), robustness, and high-detection efficiency (e.g., easy to fabricate a device having detection efficiency at the maximum of the quantum regime). Unfortunately, it can be challenging to find a material that has all of the above desirable properties. For example, niobium nitride (NbN) can outperform most other materials with respect to their time performance, while tungsten silicide ($W_xSi_{1-x}$) allows robust fabrication process that reproducibly results in devices with detection efficiency near its quantum regime.

In one example, the superconducting nanowire meander structure 520 includes NbN in the first layer 520a and $W_xSi_{1-x}$ in the second layer 520b. In another example, the order can be reversed, i.e., the superconducting nanowire meander structure 520 includes $W_xSi_{1-x}$ in the first layer 520a and NbN in the second layer 520b. In practice, the NbN is typically grown at high temperature (e.g., at about 850° C.) and the $W_xSi_{1-x}$ at low temperatures (e.g., room temperature), so it can be more convenient to grow first the NbN and then, after the material is cooled down, grow the $W_xSi_{1-x}$. In either case, the proximity effect can induce the resulting hybrid superconducting nanowire meander structure 520 to have both short characteristic time constants and high detection efficiency. More specifically, because the time performance can be related to the ability of the superconducting information to transfer fast in the medium, when placing two media in adjacent, the superconducting information can be transferred in the medium with the greatest mobility. As a result, in the superconducting nanowire meander structure 520, the competitive time performance of the NbN can dominant that of the device 500 (i.e. the device reset time). Likewise, the detection efficiency can be related to the ability to absorb radiation, so that in the hybrid, the $W_xSi_{1-x}$ can dominant the quantum efficiency.

In addition, it can be desirable for the interface between the two (or more) superconductors in the hybrid superconductor to allow as much free mobility of electrons between the two superconducting materials as possible so as to facilitate good hybridization. For this reason, when the materials are cooled down between the two depositions of the two materials, it can be helpful to maintain the materials in a very clean environment (e.g., ultra-high vacuum conditions).

Other than SNSPD, hybrid superconductors described herein can also be used to construct a transition edge sensor (TES), which can function a thermometer made from a superconducting film operated near its critical temperature $T_c$. While in its transition from superconductor to normal metal, a very small change in temperature causes a large change in resistance, thereby providing information to derive the temperature. This sensitivity can also be used as sensitive particle detectors, including photon (light/radiation) detection.

Figure 6:
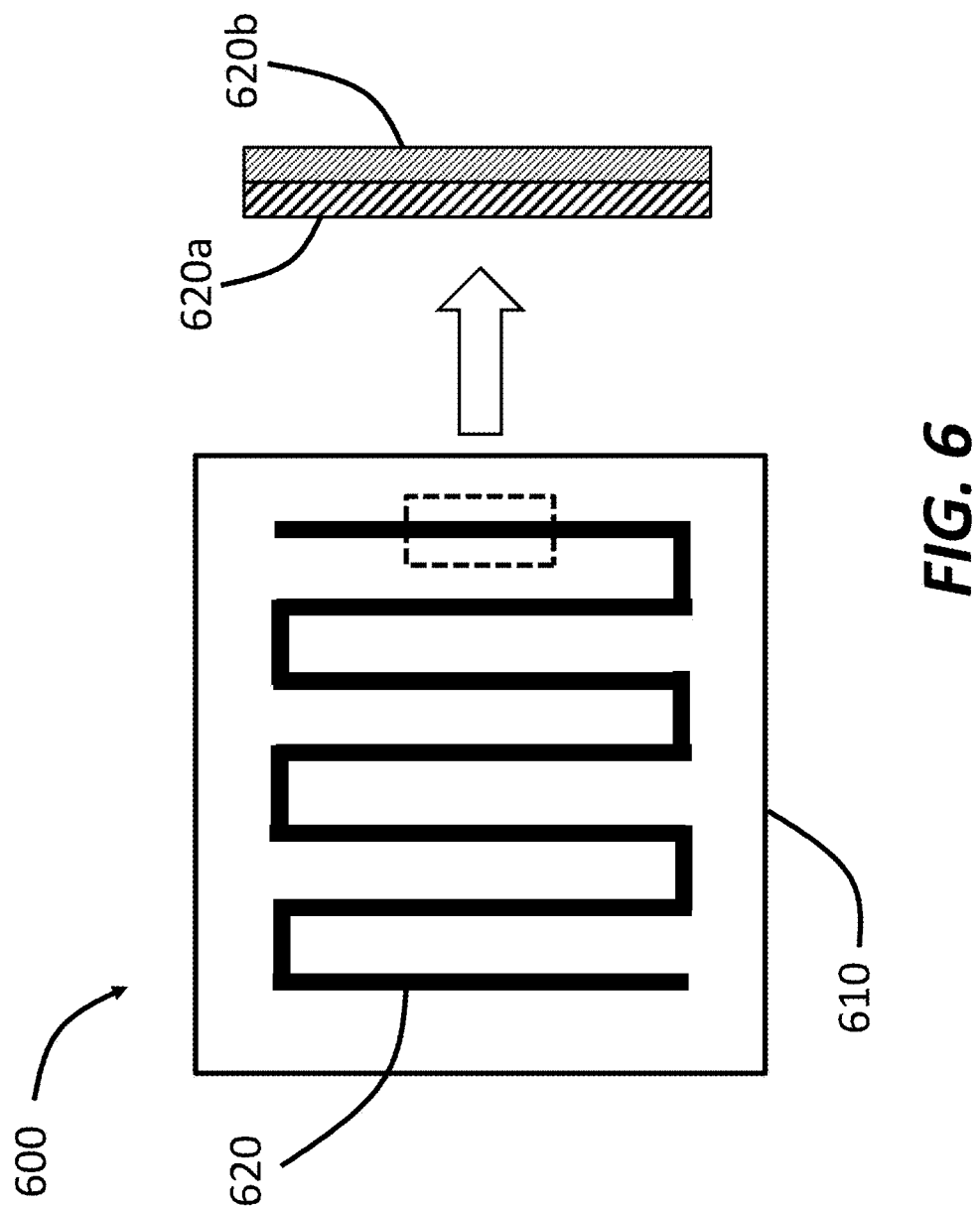
FIG. 6 shows a top view of a superconducting nanowire single photon detector (SNSPD) using superconducting medium that includes two superconductor stripes.

FIG. 6 shows a top view of an SNSPD 600, in which the nanowire made of two parallel stripes of superconductors. The SNSPD 600 includes a substrate 610 and a superconducting nanowire meander structure 620 disposed on the substrate 610. The magnified view of a portion of the superconducting nanowire meander structure 620 on the right shows that the nanowire includes two stripes 620a and 620b disposed parallel to each other. The first stripe 620a includes a first superconductor and the second stripe 620b includes a second superconductor. The width of the two stripes 620a and 620b is less than the coherence length of the corresponding superconductor material in the respective stripe so as to induce proximity effect between the two stripes 620a and 620b. This in turn allows the superconducting nanowire meander structure 620 to have enhanced and controlled properties desirable in single photon detection.

The two configurations of hybrid superconductors used in the superconducting nanowire meander structures 520 and 620 are for illustrative purposes only. In practice, the superconducting nanowire meander structures 520 and 620 can use any of the configurations of hybrid superconductors described in this application.

Figures 7A, 7B:
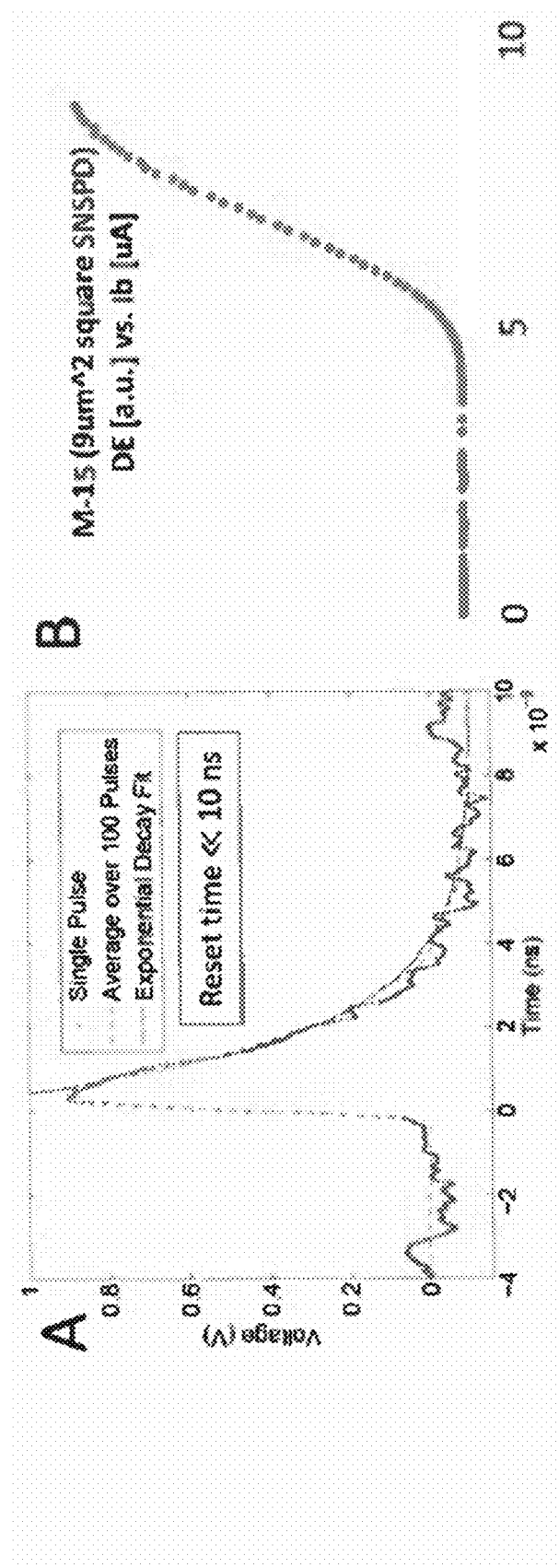
FIG. 7A shows measured reset time of an SNSPD using hybrid nanowires including NbN and $W_xSi_{1-x}$.
FIG. 7B shows measured detection efficiency of an SNSPD using superconducting medium including NbN and $W_xSi_{1-x}$.

FIGS. 7A-7B show experimental results of an SNSPD using the configuration shown in FIGS. 5A-5B. The SNSPD uses a nanowire meander including NbN in one layer and $W_xSi_{1-x}$ in another layer to form a hybrid superconductor. Each layer has a thickness of about 2 nm, less than calculated coherence length of the superconducting materials used in the detector. The detector is also cooled at about 2.5 K.

FIG. 7A shows the measured reset time of the SNSPD and FIG. 7B shows the measured detection efficiency of the SNSPD. FIG. 7A demonstrates that the time performance of the hybrid SNSPD is comparable to a NbN-based SNSPD. Similarly, FIG. 7B illustrates that the detection efficiency of the device is saturating as a function of applied bias current, indicating that the device operates near the maximum quantum efficiency limit, which is a comparable behavior to a $W_xSi_{1-x}$-based SNSPD.

Figure 8:
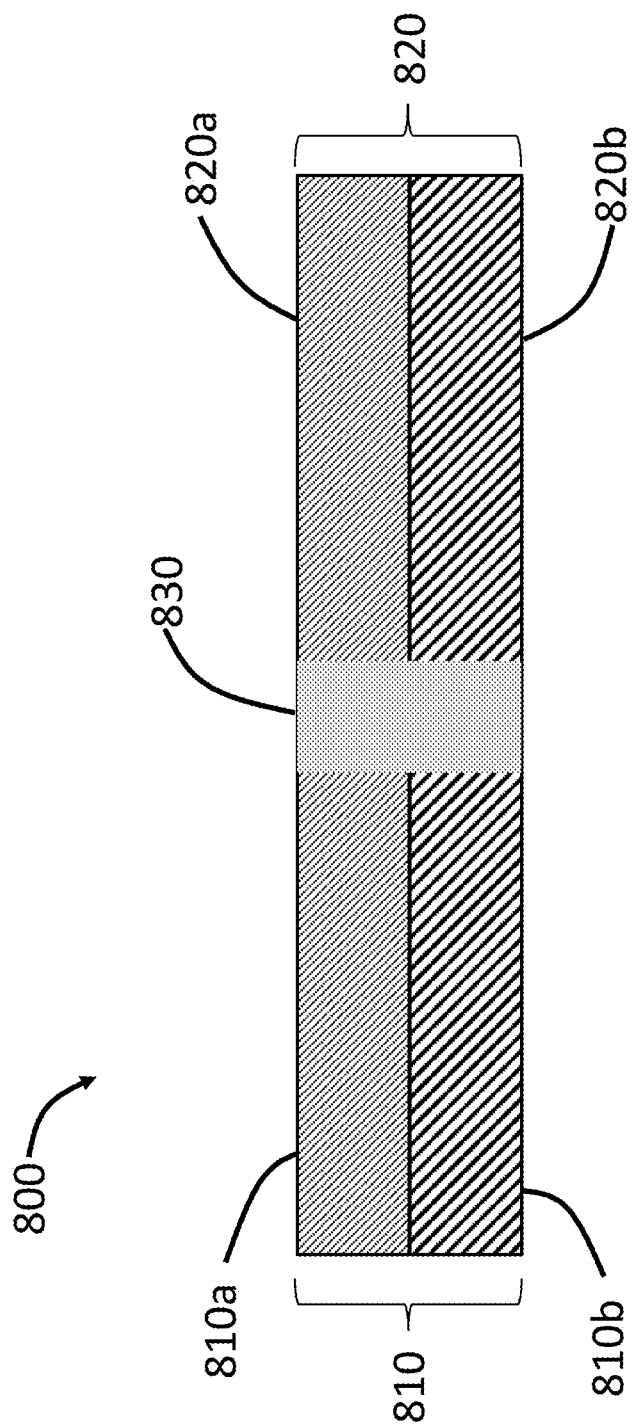
FIG. 8 shows a side view of a hybrid superconducting medium including a weak link to function as a Josephson junction or a Dayem bridge.

FIG. 8 shows a side view of a device 800 including hybrid superconducting medium and a weak link to function as a Josephson junction or a Dayem bridge. The device 800 includes a first hybrid superconductor 810 and a second hybrid superconductor 820, separated by an insulator 830. The first hybrid superconductor 810 includes a first layer 810a made of one superconducting material and a second layer 810b made of another superconducting material. The two layers 810a and 810b have thicknesses less than the coherence length of the superconducting material in the respective layer. Similarly, the second hybrid superconductor 820 also includes a first layer 820a made of one superconducting material and a second layer 820b made of another superconducting material. The two layers 820a and 820b have thicknesses less than the coherence length of the superconducting material in the respective layer.

In the device 800, electrons from one hybrid superconductor (810 or 820) can tunnel through the insulator 830 even with zero voltage applied across the superconductors 810 and 820. If a voltage is applied across the device 800, the current decreases and oscillates at a high frequency proportional to voltage and the device 800 can function as a Josephson junction. The relationship between applied voltage and frequency is very precise such that the standard volt is now defined in terms of Josephson junction oscillation frequency. The Josephson junction can also serve as a hyper-sensitive detector of low level magnetic fields. It is also very sensitive to electromagnetic radiation from microwaves to gamma rays.

In one example, the first hybrid superconductor 810 and the second superconductor 820 can be the same, i.e., the first layers 810a and 820a are made of the same first material, the second layers 810b and 820b are made of the same second material. In another example, the first hybrid superconductor 810 can be different from the second hybrid superconductor 820.

The device 800 can be used as building blocks of many other devices, such as Josephson transistors, superconducting quantum interference devices (SQUIDs), and rapid single flux quantum (RSFQ), among others. For example, an electrode can be placed close to the insulator 830 of the device 800 to form a Josephson transistor. The electrode can influence the junction by capacitive coupling. A major feature of the Josephson transistor is low power dissipation applicable to high density circuitry, for example, computers.

Figures 9A, 9B:
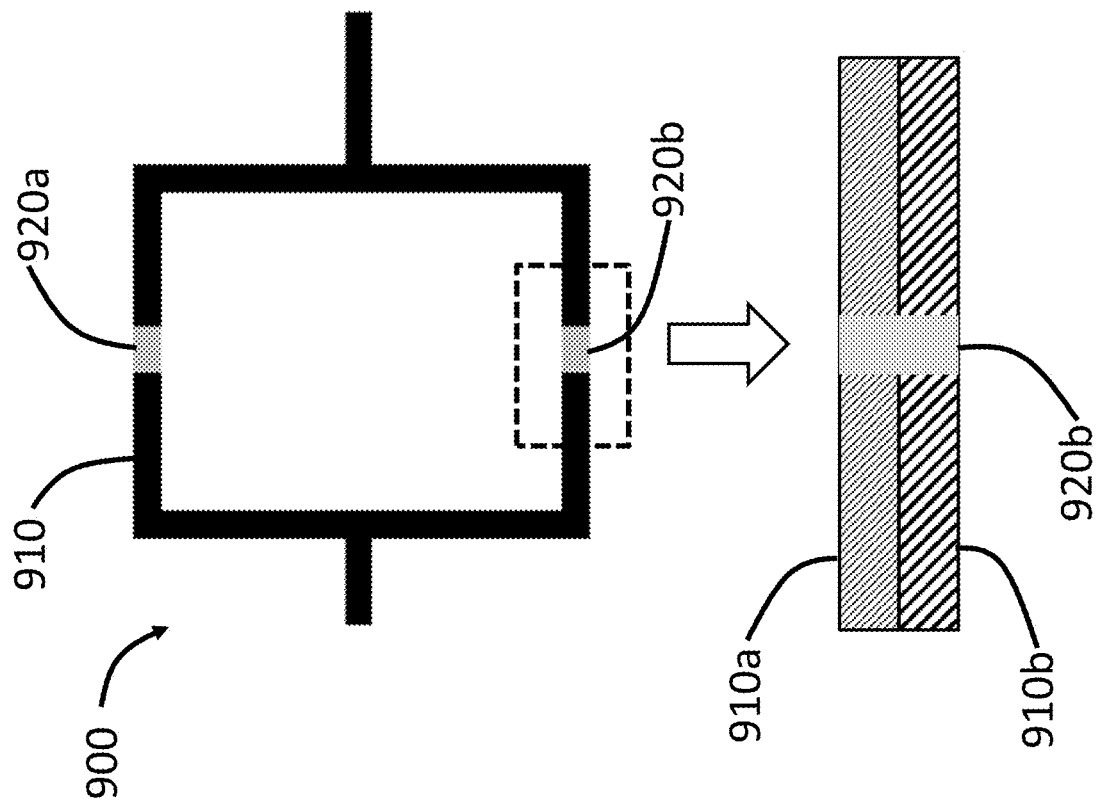
FIGS. 9A and 9B show a top view and a side view, respectively, of a superconducting quantum interference device (SQUID) using hybrid superconducting medium.

FIGS. 9A-9B shows a schematic of a SQUID 900 using hybrid superconductors described in this application. The SQUID 900 includes a superconducting ring 910 separated by two insulators 920a and 920b. A magnified portion of the SQUID 900, as shown in FIG. 9B, illustrates the insulator 920b sandwiched by the hybrid superconductor 910. The superconductor 910 includes a first layer 910a made of a first superconductor and a second layer 910b made of a second superconductor. Each of the two layers 910a and 910b is thinner than the coherence length of the superconductor in the respective layer. The magnified section shown in FIG. 9B can be substantially identical to the device 800 shown in FIG. 8.

In one example, the first layer 910a includes a conventional superconductor and the second layer 910b includes an unconventional superconductor. As understood in the art, the coherence length of an unconventional superconductor is not isotropic. In an orthorhombic superconductor, the coherence length in the c-axis direction is much less than in the a and b directions. Correspondingly, the critical current can be much smaller in the c-axis direction. Furthermore, the coherence length in all directions of an unconventional superconductor is small enough for a weak link to form easily at any junction. Given that the Josephson Effect is present in all weak links, the short coherence length can pose a difficulty for forming devices that utilize unconventional superconducting materials. Therefore superconducting single electron transistors (SET's) have generally been made from conventional superconductors. On the other hand, the oscillations of a SET made from an unconventional superconducting material can have only a single charge periodicity, not both a single and a double charge period. This can be useful in superconducting quantum computing, where a mechanism for controllable switching of supercurrent is important and where the supercurrent charge carriers are Cooper pairs. Therefore, by combing conventional superconductor and unconventional superconductor in the hybrid superconductor 910, the SQUID 900 can have desirable properties of both conventional superconductor and unconventional superconductor.

In another example, the first layer 910a includes an s-wave superconductor and the second layer includes a d-wave superconductor. In yet another example, the first layer 910a includes at least one of aluminum, lead, and niobium, and the second layer 910b includes at least one of $YBa_2Cu_3O_x$, $Bi_2Sr_2Ca_{n-1}Cu_nO_{2n+4}$, $Tl_2Ba_2CuO_x$, $HgBa_2CuO_4$, $Sr_2RuO_4$, and $CeIrIn_5$.

Figure 10:
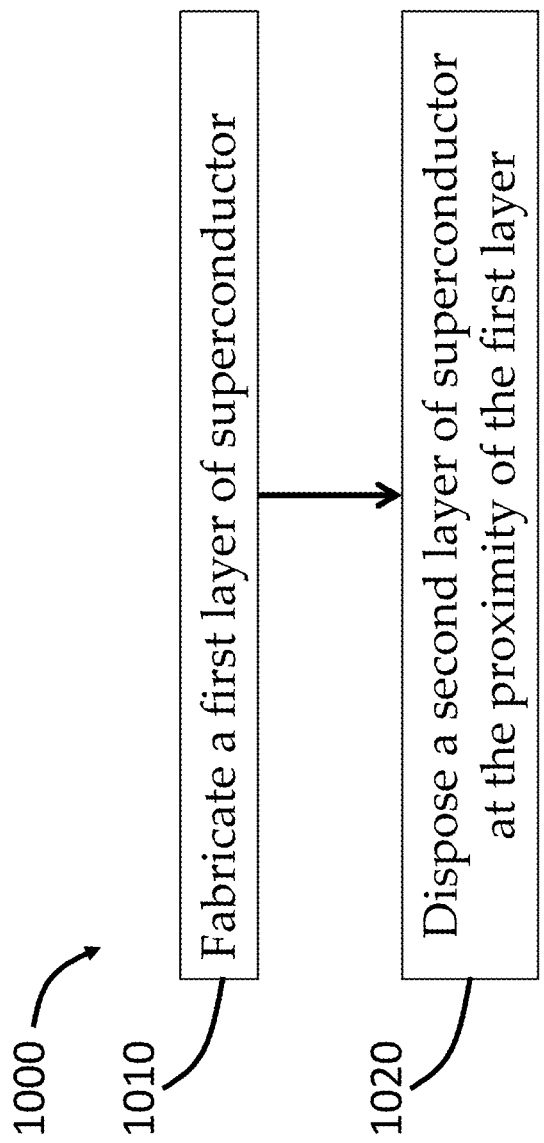
FIG. 10 illustrates a method of fabricating a hybrid superconductor.

FIG. 10 illustrates a method 1000 of fabricating a hybrid superconductor. At step 1010 of the method 1000, a first layer made of a first superconductor is fabricated. The first layer of superconductor can be, for example, deposited on a substrate using nanofabrication techniques. Example nanofabrication techniques can include sputtering process, chemical vapor deposition (CVD), physical vapor deposition (PVD), atomic layer deposition techniques (ALD), pulsed laser deposition (PLD), molecular beam epitaxy (MBE), sol-gel and other solid-state-based techniques, and film exfoliation, among others. The fabricated first layer has a thickness less than a coherence length of the first superconductor. At step 1020 of the method 1000, a second layer made of a second superconductor is disposed on the first layer. The fabricated second layer has a thickness less than a coherence length of the second superconductor.

In one example, the fabricated hybrid superconductor including the first layer and the second layer can be removed from the substrate via etching processes. The removed hybrid superconductor can then be used to construct other superconducting devices. In another example, the fabricated hybrid superconductor can stay on the substrate during subsequent manufacturing of devices such as a SQUID.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A superconducting medium comprising:
 a first layer comprising a first superconductor, the first layer having a first thickness less than about three times a second coherence length of a second superconductor; and
 a second layer comprising the second superconductor, different from the first superconductor, disposed on the first layer, the second layer having a second thickness less than about three times a first coherence length of the first superconductor so as to induce a proximity effect between the first layer and the second layer.

2. The superconducting medium of claim 1, wherein the first superconductor comprises a crystalline material and the second superconductor comprises an amorphous material.

3. The superconducting medium of claim 1, wherein the first superconductor comprises NbN and the second super conductor comprises $W_xSi_{1-x}$.

4. The superconducting medium of claim 3, wherein each of the first thickness and the second thickness is less than 3 nm.

5. The superconducting medium of claim 1, wherein the first thickness is the same as the second thickness.

6. The superconducting medium of claim 1, wherein the first thickness is the different from the second thickness.

7. The superconducting medium of claim 1, wherein each of the first thickness and the second thickness is less than about 500 nm.

8. The superconducting medium of claim 1, wherein the first superconductor comprises a conventional superconductor and the second superconductor comprises an unconventional superconductor.

9. The superconducting medium of claim 1, wherein the first superconductor comprises an s-wave superconductor and the second superconductor comprises a d-wave superconductor or a p-wave superconductor.

10. The superconducting medium of claim 1, wherein the first superconductor comprises at least one of aluminum, lead, and niobium, and the second superconductor comprises at least one of $YBa_2Cu_3O_x$, $Bi_2Sr_2Ca_{n-1}Cu_nO_{2n+4}$, $Tl_2Ba_2CuO_x$, $HgBa_2CuO_4$, $Sr_2RuO_4$, $CeIrIn_5$, $MgB_2$, iron pnictide superconductors, and organic superconductors.

11. The superconducting medium of claim 1, wherein the first and second superconductors comprises at least one of $YBa_2Cu_3O_x$, $Bi_2Sr_2Ca_{n-1}Cu_nO_{2n+4}$, $Tl_2Ba_2CuO_x$, $HgBa_2CuO_4$, $Sr_2RuO_4$, $CeIrIn_5$, $MgB_2$, iron pnictide superconductors, and organic superconductors, wherein said first and second superconductor are different.

12. The superconducting medium of claim 1, wherein the first superconductor has a first value of a physical property, the second superconductor has a second value of the physical property, and a third value of the physical property of the superconducting medium is substantially equal to one of the first value or the second value facilitated by the proximity effect.

13. The superconducting medium of claim 12, wherein the physical property comprises an electronic property including at least one of an electro-optical property, an electro-mechanical property, an electromagnetic property, or a supercurrent.

14. The superconducting medium of 12, wherein the physical property comprises at least one of a critical magnetic field, a critical current, a critical temperature, magnetic inductance, thermal conductivity, or a resistance at normal state.

15. A method of fabricating a superconducting medium, the method comprising:
 providing a first layer comprising a first superconductor, the first layer having a first thickness less than a second coherence length of a second superconductor; and
 disposing a second layer comprising the second superconductor, different from the first superconductor, onto the first layer so as to form the superconducting medium, the second layer having a second thickness less than a first coherence length of the first superconductor so as to induce an proximity effect between the first layer and the second layer.

16. The method of claim 15, wherein the first superconductor comprises NbN and the second super conductor comprises $W_xSi_{1-x}$.

17. The method of claim 15, wherein the NbN layer is thinner than 3 nm and disposing the second layer comprises depositing the second layer for less than 3 nm.

18. The method of claim 15, wherein disposing the second layer comprises depositing the second layer via a sputtering process.

19. The method of claim 15, wherein disposing the second layer comprises depositing the second layer to have the second thickness substantially equal to the first thickness.

20. The method of claim 15, wherein disposing the second layer comprises depositing the second layer to have the second thickness different from the first thickness.

21. The method of claim 15, wherein each of the first thickness and the second thickness is less than about 500 nm.

22. The method of claim 15, wherein the first superconductor comprises a conventional superconductor and the second superconductor comprises an unconventional superconductor.

23. The method of claim 15, wherein the first superconductor comprises an s-wave superconductor and the second superconductor comprises a d-wave superconductor or a p-wave superconductor.

24. The method of claim 15, wherein the first superconductor comprises at least one of aluminum, lead, and niobium, and the second superconductor comprises at least one of $YBa_2Cu_3O_x$, $Bi_2Sr_2Ca_{n-1}Cu_nO_{2n+4}$, $Tl_2Ba_2CuO_x$, $HgBa_2CuO_4$, $Sr_2RuO_4$, $CeIrIn_5$ $MgB_2$, iron pnictide superconductors, and organic superconductors.

25. The method of claim 15, wherein the first and second superconductors comprises at least one of $YBa_2Cu_3O_x$, $Bi_2Sr_2Ca_{n-1}Cu_nO_{2n+4}$, $Tl_2Ba_2CuO_x$, $HgBa_2CuO_4$, $Sr_2RuO_4$, $CeIrIn_5$, $MgB_2$, iron pnictide superconductors, and organic superconductors, wherein said first and second superconductor are different.

26. The method of claim 15, wherein the first superconductor has a first value of a physical property, the second superconductor has a second value of the physical property, and a third value of the physical property of the superconducting medium is substantially equal to one of the first value or the second value facilitated by the proximity effect.

27. The method of claim 26, wherein the physical property comprises an electronic property including at least one of an electro-optical property, an electro-mechanical property, an electromagnetic property, or a supercurrent.

28. The method of claim 26, wherein the physical property comprises at least one of a critical magnetic field, a critical current, a critical temperature, magnetic inductance, thermal conductivity, or a resistance at normal state.

29. The method of claim 26, further comprising:
changing a ratio of the first thickness to the second thickness so as to adjust the third value of the physical property of the superconducting medium.

30. The method of claim 26, further comprising:
changing a temperature of at least one of the first layer or the second layer so as to adjust the third value of the physical property of the superconducting medium.

31. A single photon detector comprising:
a substrate; and
a superconductive nanowire meander structure, disposed on the substrate to receive incident photons, the superconductive nanowire meander structure comprises:
a first layer comprising NbN, the first layer having a first thickness less than 3 nm; and
a second layer comprising $W_xSi_{1-x}$ disposed on the first layer, the second layer having a second thickness less than 3 nm so as to induce an proximity effect between the first layer and the second layer,
wherein x ranges from about 0.2 to about 0.6.

* * * * *